(12) United States Patent
Laermer et al.

(10) Patent No.: US 8,154,174 B2
(45) Date of Patent: Apr. 10, 2012

(54) BENDING TRANSDUCER DEVICE FOR GENERATING ELECTRICAL ENERGY FROM DEFORMATIONS AND CIRCUIT MODULE

(75) Inventors: Franz Laermer, Weil Der Stadt (DE); Thorsten Pannek, Stuttgart (DE); Ralf Reichenbach, Esslingen (DE); Marian Keck, Herrenberg (DE)

(73) Assignee: Robert Bosch GmbH, Stuttgart (DE)

( * ) Notice: Subject to any disclaimer, the term of this patent is extended or adjusted under 35 U.S.C. 154(b) by 401 days.

(21) Appl. No.: 12/455,428

(22) Filed: Jun. 1, 2009

(65) Prior Publication Data

US 2010/0007246 A1   Jan. 14, 2010

(30) Foreign Application Priority Data

Jun. 26, 2008   (DE) .................... 10 2008 002 680

(51) Int. Cl.
*H01L 41/08* (2006.01)
(52) U.S. Cl. ....................... 310/329; 310/339
(58) Field of Classification Search .......... 310/329–332, 310/339
See application file for complete search history.

(56) References Cited

U.S. PATENT DOCUMENTS

| | | | | |
|---|---|---|---|---|
| 4,104,553 A | * | 8/1978 | Engdahl et al. | 310/352 |
| 4,708,600 A | * | 11/1987 | AbuJudom et al. | 417/322 |
| 4,972,713 A | * | 11/1990 | Iwata | 73/654 |
| 5,053,671 A | * | 10/1991 | Kobayashi et al. | 310/329 |
| 6,053,045 A | * | 4/2000 | Nakamura | 73/514.34 |
| 7,936,109 B1 | * | 5/2011 | Gao et al. | 310/329 |
| 2008/0100179 A1 | * | 5/2008 | Ruggeri et al. | 310/332 |

FOREIGN PATENT DOCUMENTS

DE   10 2007 006 994   2/2008

* cited by examiner

*Primary Examiner* — Mark Budd
(74) *Attorney, Agent, or Firm* — Kenyon & Kenyon LLP

(57) ABSTRACT

A bending transducer device for generating electrical energy includes at least one elastically deformable support structure, one piezoelectric element, and a bearing device. The piezoelectric element is configured and situated on the support structure in such a way that the piezoelectric element is deformable due to a deformation of the support structure caused by vibration, and the support structure is supported vibration-capably in at least one bearing of the bearing device, the bearing being configured as an articulated receptacle, e.g., a hinge.

15 Claims, 2 Drawing Sheets

BENDING TRANSDUCER DEVICE FOR GENERATING ELECTRICAL ENERGY FROM DEFORMATIONS AND CIRCUIT MODULE

BACKGROUND OF THE INVENTION

1. Field of the Invention

The present invention relates to a bending transducer device for generating electrical energy and a circuit module.

2. Description of Related Art

For applications of low power consumption, it is known to use piezoelectric materials for the power supply which generate electrical energy from surrounding energies, in particular from vibrations and deformations (also referred to as "energy harvesting"). The deformations may be converted into electrical energy with the aid of a bending transducer device. Such a bending transducer device which has an elastically deformable support structure and a bearing device in addition to a piezoelectric element is disclosed in published German patent document DE 10 2007 006 994. The piezoelectric element is designed and situated on the support structure in such a way that, due to a deformation of the support structure caused by vibrations, the piezoelectric element is deformable, the support structure being supported vibration-capably in the bearing device. The voltage generated by deforming the piezoelectric element may be picked up via a metal coating on both the top and the bottom of the piezoelectric element. The bending transducer device is part of a circuit module which is usable as an energetically self-sustaining sensor module for measuring a pressure and/or a temperature and/or an acceleration of a tire.

An important criterion for the usability of such bending transducer devices, in particular as a component of an above-described circuit module, is their long service life. During use in a tire in particular, such a bending transducer device is exposed to high mechanical stresses. The bearing, in particular, in which the support structure is supported, is exposed to mechanical stresses. Such stresses are generated by the vibration of the support structure. If the support structure is fixedly restrained, or as in published German patent document DE 10 2007 006 994 supported in a groove of the housing, the service life may be reduced due to abrasion.

BRIEF SUMMARY OF THE INVENTION

The bending transducer device according to the present invention provides that at least one bearing of the bearing device, which accommodates the support structure, is designed as an articulated receptacle. An articulated receptacle is understood here as a receptacle which allows a swivel motion around a swivel axis and which advantageously also defines this swivel motion, in particular by using an articulation lug and/or an articulation axis.

The articulated receptacle is advantageously a hinge.

The use of an articulation, in particular of a hinge as a bearing, enables a long-lasting installation of the support structure in the bearing device. The hinge may reduce the mechanical stress by the fact that it swivels about a hinge axis during the vibration of the support structure.

By using a hinge, it is possible, in a preferred loose installation of the support structure in the hinge, to avoid the resonance frequency of the vibrating system of the bending transducer device, which typically has also a seismic mass besides the support structure and the piezoelectric element, increasing undesirably, which would be the case, for example, in a fixed, immovable restraint of the support structure. In contrast to a loose restraint of the support structure from the top and bottom, using a hinge offers the advantage that installation with only little play is possible, which prevents the support structure from sliding around in the bearing or even leaving it. However, sufficiently low resonance frequencies are advantageous if one would use such a bending transducer device as a component of a power supply device of a circuit module, which is to be used in a tire, as a sensor module, for example.

Furthermore, by using a hinge, the support structure or the vibration-capable system may be restricted in its oscillation since the hinge may stiffen the support structure with increasing oscillation (whereby the spring constant increases). This is advantageous, for example, when the support structure or the vibration-capable system is exposed to high static accelerations which are superimposed by vibrations or shocks.

DETAILED DESCRIPTION OF THE INVENTION

Figure 1:
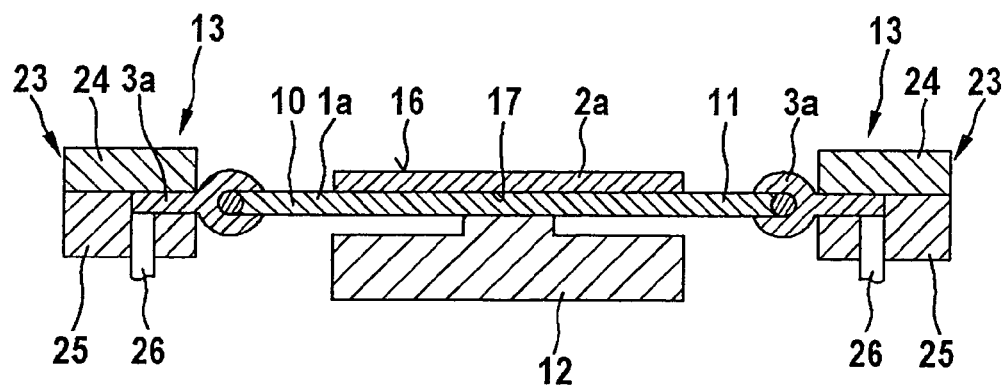
FIG. 1 shows a section through a first example embodiment of a bending transducer device according to the present invention.

In the following description and in the accompanying figures, the same components are indicated with the same reference numerals.

Figure 3:
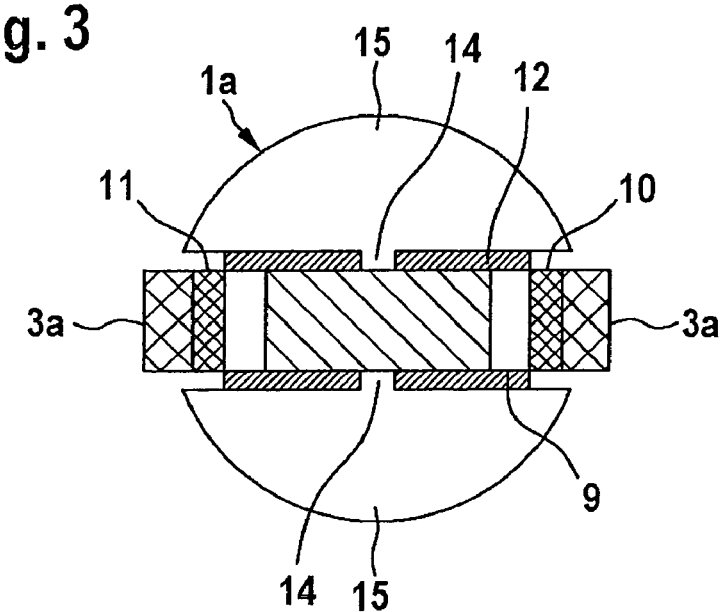
FIG. 3 shows a top view onto the bending transducer device according to the first example embodiment.

FIG. 1 shows a first example embodiment of a bending transducer device according to the present invention for generating electrical energy from deformations. The bending transducer device is part of a power supply device of a circuit module which is not shown in greater detail here. The bending transducer device includes an elastically deformable support structure 1a, a piezoelectric element 2a, a seismic mass 12, and a bearing device 13. Support structure 1a, piezoelectric element 2a, and seismic mass 12 form a vibration-capable system. Support structure 1a has a beam-shaped section 9 (see FIG. 3). In the middle of beam-shaped area 9, two bars 14 branch off to the left and right which each meet a curved, wing-like section 15. The beam-shaped section 9 is provided to accommodate piezoelectric element 2a; the seismic mass is attached, here using adhesion, to support structure 1a via wing-shaped areas 15. Support structure 1a is designed as a thin, plane-parallel, and essentially circular element which is advantageous for layered, compact structures of a bending transducer device. In this exemplary embodiment, the support structure is made of an electrically conductive metal sheet composed of spring steel.

Piezoelectric element 2a is a piezoelectric ceramic in this case which is situated in the form of a strip in the middle area of beam-shaped section 9 of support structure 1a on its top. End areas 10, 11 of beam-shaped section 9 are not covered by piezoelectric element 2a, in particular. On its top 16 and its bottom 17, piezoelectric element 2a has a metal layer (not shown) via which the voltage generated by piezoelectric element 2a may be picked up. Piezoelectric element 2a is attached on its bottom 17 to support structure 1*a* via a conductive adhesive, whereby it is possible to indirectly pick up the voltage via support structure 1*a*. On top 16 of piezoelectric element 2*a*, the voltage is indirectly picked up via a conductive spring steel sheet (not shown). As an alternative, contacting may also take place by soldering or bonding a wire on top 16 of the piezoelectric element, or another known method may be used.

Figure 7:
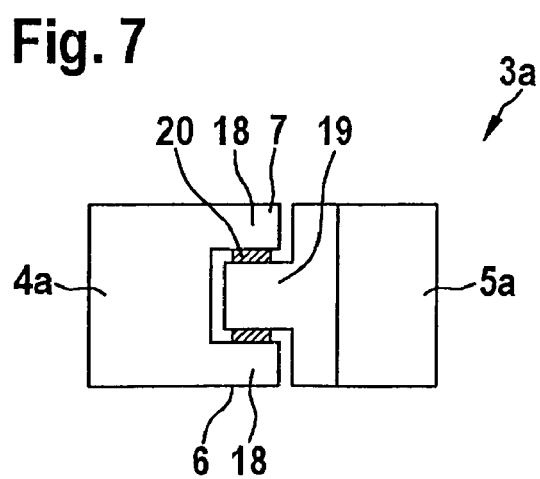
FIG. 7 shows a top view onto the hinge according to the first example embodiment.

Bearing device 13 has two bearings designed as hinges 3*a*. Support structure 1*a* is supported in bearing device 13 via hinges 3*a*. Hinge 3*a* is illustrated in greater detail in FIG. 3, which shows a side view of hinge 3*a*, and in FIG. 7, which shows a top view onto hinge 3*a*. Hinge 3*a* has a first hinge element 4*a* and a second hinge element 5*a* which are connected to one another via a hinge articulation 7 and are pivotable about a hinge axis 6 formed by hinge articulation 7. Hinge articulation 7 is formed in that first hinge element 4*a* forms two sleeves 18 at the edge and second hinge element 5*a* forms one sleeve 19 at the edge, sleeves 18, 19 of hinge elements 4*a*, 5*a* being situated aligned to one another and sleeve 19 of the second element is situated between the two sleeves 18 of first element 4*a*. A pin 20 passes through sleeves 18, 19. First hinge element 4*a* and second hinge element 5*a* are formed from an electrically conductive metal sheet; pin 20 is also made of an electrically conductive metal. Pin 20 is fixedly connected to sleeve 19 of the second element via a soldered connection. In addition, hinge articulation 7 is lubricated using an electrically conductive graphite-based lubricant. This makes it possible to conduct current from second hinge element 5*a* to first hinge element 4*a*.

Figure 4:
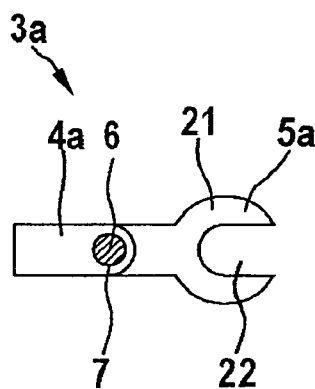
FIG. 4 shows a first example embodiment of a hinge.

Second hinge element 5*a* has a bearing area 21 having a recess 22 which is U-shaped in profile on its end opposite sleeve 19; see FIG. 4. End area 10 or 11 of beam-shaped section 9 of support structure 1*a* is accommodated in this receptacle 22. End area 10 or 11 is surrounded by receptacle 22 on three sides, i.e., the top, bottom, and front. The dimensions of receptacle 22 are selected in such a way that support structure 1*a* is supported loosely, but only with little play, in hinge 3*a*. A lateral shortening of support structure 1*a* when it bends due to its vibrating motion is thus allowed.

While second hinge element 5*a* of a hinge 3*a* accommodates support structure 1*a*, first hinge element 4*a* is fixedly restrained in a housing 23 between a housing cover 24 and a housing bottom 25. Electrical contact tracks 26 are provided in housing bottom 25 which electrically contact hinges 3*a*. An electrical connection to other components of the device may be established via such electrical contact tracks 26. Electrical contact track 26 may be designed as a lead frame or as an insert.

Figure 2:
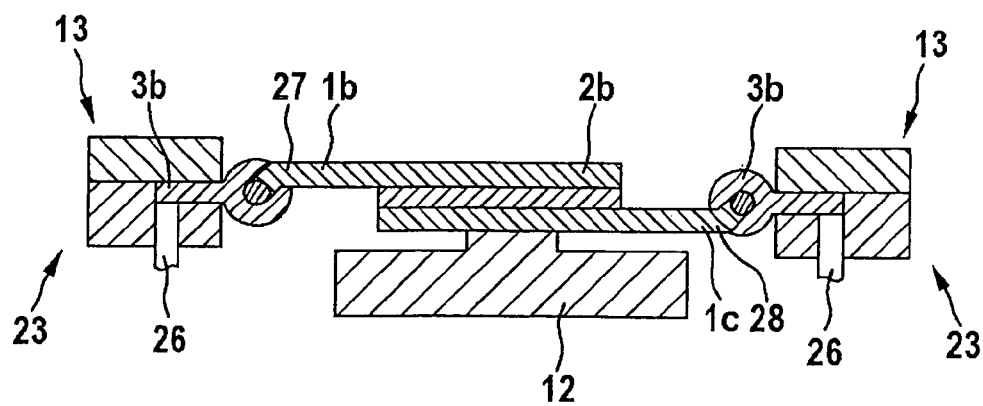
FIG. 2 shows a section through a second example embodiment of a bending transducer device according to the present invention.

FIG. 2 shows a second example embodiment of a bending transducer device according to the present invention. In contrast to the first specific embodiment, the bending transducer device has a second elastically deformable and electrically conductive support structure 1*c* in addition to a first elastically deformable and electrically conductive support structure 1*b*. First support structure 1*b* and second support structure 1*c* are designed as essentially planar, electrically conductive metal sheets similar to support structure 1*a* of the first specific embodiment. A seismic mass 12 is attached to the bottom of second support structure 1*c*. A piezoelectric element 2*b* is situated between first and second support structures 1*b*, 1*c* in such a way that support structure 1*b* lies flat on the top of piezoelectric element 2*b* and second support structure 1*c* lies flat against the bottom of piezoelectric element 2*b*. Support structures 1*b* and 1*c* are supported in a hinge 3*b* only on one side. Support structures 1*b*, 1*c* are angled in their respective end areas 27 and 28 via which they are supported in hinge 3*b*, since hinges 3*b* lie in a shared plane. A receptacle of hinges 3*b*, which is designed like receptacle 22 of hinge 3*a*, is appropriately aligned. Otherwise, the second specific embodiment corresponds to the first specific embodiment, in particular hinge 3*b* corresponds to hinge 3*a* of the first specific embodiment.

The second example embodiment of a bending transducer device shows an option of picking up the voltage generated by piezoelectric element 2*b* via two support structures 1*b*, 1*c*. Using the electrically conductive hinges 3*b*, electrical contacting may be continued to the intended points via electrical contact tracks 26.

Support structures 1*b*, 1*c* may have the same thickness or, in particular for securing the neutral fiber, may have different thicknesses.

The piezoelectric element, which has a monomorphic design here, may also have a bimorphic design.

In a variant of the second specific embodiment, four hinges 3*b* may be provided instead of two hinges 3*b*, whereby in each case one support structure 1*b* is held by two hinges 3*b*. Support structures 1*b*, 1*c* may be designed as planar elements and in each case two hinges 3*b*, which hold one support structure 1*b*, 1*c*, are situated in one plane. In this case corresponding to the first specific embodiment, piezoelectric element 2*b* is only stressed for bending, but it may nevertheless be electrically contacted on both the top and bottom.

In one embodiment of this variant, only one of the two hinges, which hold one support structure, is electrically connected to one electrical contact track, two hinges being selected which are situated on different sides of piezoelectric element 2*b*. This makes simple contacting of the hinges possible.

Figure 5:
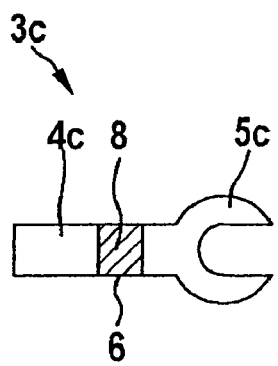
FIG. 5 shows a second example embodiment of a hinge.
Figure 6:
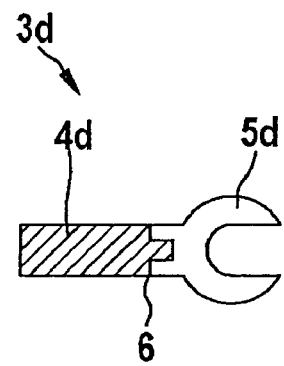
FIG. 6 shows a third example embodiment of a hinge.

There are further variants for designing the bending transducer device. For example, hinge 3*a* or hinge 3*b* may be designed as a sliding contact having a contact ring or a brush, for example. Further alternatives for the design of a hinge are shown in FIGS. 5 and 6. According to a second specific embodiment, hinge 3*c* has an elastically deformable area 8 which is situated between a rigid first hinge element 4*c* and a rigid second hinge element 5*c*. Elastically deformable area 6 forms a hinge axis about which first hinge element 4*c* and second hinge element 5*c* may be pivoted. According to a third specific embodiment of a hinge 3*d*, hinge 3*d* includes a first hinge element 4*d*, which is elastically deformable, and a rigid second hinge element 5*d*. First hinge element 4*d* and second hinge element 5*d* are connected to one another, here via a tongue and groove connection. The elasticity of first hinge element 4*d* ensures the formation of a swivel axis 6. It is also conceivable to design the hinge in one piece made of an elastically deformable material.

Instead of a support structure 1*a*, 1*b*, 1*c* made of metal, support structures on the basis of plastic or resin may alternatively also be used. In order to enable electrical contacting of the piezoelectric element, these support structures may be provided with suitable contact tracks, for example.

The described circuit module having the bending transducer device is suitable, for example, to be used as an energetically self-sufficient sensor module, in particular as a tire sensor module for measuring an interior tire pressure and/or a temperature and/or accelerations.

What is claimed is:

1. A bending transducer device for generating electrical energy from deformations, comprising:
   at least one elastically deformable support structure;
   at least one piezoelectric element; and
   a bearing device having at least one bearing configured as an articulated receptacle;

wherein the piezoelectric element is configured and situated on the support structure in such a way that the piezoelectric element is deformable due to a deformation of the support structure, and wherein the support structure is supported vibration-capably in the at least one bearing of the bearing device;

wherein the support structure is loosely supported in the at least one articulated receptacle.

2. The device as recited in claim 1, wherein the loose support of the support structure enables a translational displacement of the support structure in the articulated receptacle corresponding to a lateral shortening of the support structure due to vibrating motion of the support structure.

3. The device as recited in claim 2, wherein the articulated receptacle is a hinge.

4. The device as recited in claim 3, wherein the hinge includes at least one first hinge element and at least one second hinge element configured to pivot about a hinge axis of the hinge.

5. The device as recited in claim 4, wherein the hinge has a hinge articulation forming the hinge axis, and wherein the at least one first and second hinge elements are connected to the hinge articulation.

6. The device as recited in claim 4, wherein the hinge has a deformable element forming the hinge axis, and wherein the at least one first and second hinge elements are connected to the deformable element.

7. The device as recited in claim 4, wherein one of the hinge or the first hinge element is restrained in a housing between a housing cover and a housing bottom.

8. The device as recited in claim 4, wherein the support structure includes a beam-shaped section.

9. The device as recited in claim 8, wherein the support structure is supported on at least one end of the beam-shaped section in the at least one articulated receptacle.

10. The device as recited in claim 9, wherein the support structure is supported on both ends of the beam-shaped section in the at least one articulated receptacle.

11. The device as recited in claim 4, wherein the at least one support structure is electrically conductive and forms an electrode of the piezoelectric element, the articulated receptacle is electrically conductive, and the at least one support structure is electrically contacted via the articulated receptacle.

12. The device as recited in claim 11, wherein:

a second elastically deformable and electrically conductive support structure is additionally provided;

a second electrically conductive articulated receptacle is additionally provided in the bearing device;

the first support structure and the second support structure are respectively situated on the top and bottom of the piezoelectric element;

the first support structure and the second support structure respectively form an electrode and a counter-electrode for picking up the voltage generated by the piezoelectric element; and the second support structure is supported in the second electrically conductive articulated receptacle of the bearing device, the second support structure being electrically contacted via the second articulated receptacle.

13. A circuit module, comprising:

a power supply device having a bending transducer device, wherein the bending transducer device includes:

at least one elastically deformable support structure;

at least one piezoelectric element; and a bearing device having at least one bearing configured as an articulated receptacle;

wherein the piezoelectric element is configured and situated on the support structure in such a way that the piezoelectric element is deformable due to a deformation of the support structure, and wherein the support structure is supported vibration-capably in the at least one bearing of the bearing device;

wherein the support structure is loosely supported in the at least one articulated receptacle;

wherein the bending transducer device forms a vibration-capable system for generating piezoelectric voltage; and wherein the circuit module has an energetically self-sufficient configuration.

14. The circuit module as recited in claim 13, further comprising:

a housing including a housing cover and a housing bottom;

wherein one of the articulated receptacle or a part of the articulated receptacle is restrained between the housing cover and the housing bottom, and wherein electrical contact tracks are provided in the housing to electrically contact the articulated receptacle.

15. The circuit module as recited in claim 14, wherein the circuit module is configured as a sensor module for measuring at least one of internal tire pressure, a temperature and acceleration.

* * * * *